US008697573B2

United States Patent
Duong et al.

(10) Patent No.: US 8,697,573 B2
(45) Date of Patent: Apr. 15, 2014

(54) PROCESS TO REMOVE NI AND PT RESIDUES FOR NIPTSI APPLICATIONS USING AQUA REGIA WITH MICROWAVE ASSISTED HEATING

(75) Inventors: Anh Duong, Fremont, CA (US); Olov Karlsson, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 267 days.

(21) Appl. No.: 13/292,906

(22) Filed: Nov. 9, 2011

(65) Prior Publication Data

US 2013/0115741 A1   May 9, 2013

(51) Int. Cl.
  *H01L 21/44*   (2006.01)
(52) U.S. Cl.
  USPC ........... 438/655; 438/660; 438/663; 438/682; 438/686
(58) Field of Classification Search
  USPC .................. 438/655, 197, 660, 663, 682, 686
  See application file for complete search history.

(56) References Cited

U.S. PATENT DOCUMENTS

| | | | | |
|---|---|---|---|---|
| 8,513,117 | B2 * | 8/2013 | Duong et al. | 438/655 |
| 8,518,765 | B1 * | 8/2013 | Duong et al. | 438/197 |
| 2006/0144791 | A1 | 7/2006 | Debe et al. | |
| 2007/0020925 | A1 | 1/2007 | Hsieh et al. | |
| 2009/0127594 | A1 | 5/2009 | Arunachalam | |
| 2010/0178764 | A1 * | 7/2010 | Narita et al. | 438/664 |
| 2010/0221912 | A1 | 9/2010 | Nakayama et al. | |

OTHER PUBLICATIONS

Chen, Y., et al.; Advances on 32nm NiPt Salicide Process; Jan. 1, 2009; IEEE; 17th IEEE International Conference on Advanced thermal Processing of Semiconductors 4 pages.
Goh, F., et al.; Challenges in Nickel Platinum silicide Wet Etching for Sub65nm Device Technology; Jan. 1, 2007; Chartered Semiconductor Manufacturing Ltd.; Goh F. et al.
Baghalha, M., et al.; Kinetics of Platinum Extracton From Spent Reforming Catalysts in AquaRegia Solutions; Jun. 17, 2008; Sharif University of Technology, Iran; Hydrometallurgy vol. 95 Issues 34 pp. 247253.
Al-Harahsheh, et al.; MicrowaveAssisted LeachingA Review; Jan. 1, 2004; Academia—University of Nottingham, UK; Hydrometallurgy pp. 189203.
Jafarifar, D., et al.; Ultra Fast MicrowaveAssisted Leaching for Recovery of Platinum from Spent Catalyst; Jan. 1, 2005; Jam Petrochemical Company, Iran; Hydrometallurgy pp. 166171.

* cited by examiner

*Primary Examiner* — Kimberly Rizkallah
*Assistant Examiner* — Errol Fernandes

(57) ABSTRACT

The invention discloses a method for cleaning residues from a semiconductor substrate during a nickel platinum silicidation process, comprising using an aqua regia cleaning solution (comprising a mixture of nitric acid and hydrochloric acid) with microwave assisted heating. Low boiling temperature of hydrochloric acid prevents heating the aqua regia solution to a high temperature, impeding the effectiveness of post silicidation nickel and platinum residue removal. Therefore, embodiments of the invention provide a microwave assisted heating of the substrate in an aqua regia solution, selectively heating platinum residues without significantly increasing the temperature of the aqua regia solution, rendering platinum residues to be more soluble in aqueous solution and thereby dissolving it from the surface of the substrate.

11 Claims, 7 Drawing Sheets

PROCESS TO REMOVE NI AND PT RESIDUES FOR NIPTSI APPLICATIONS USING AQUA REGIA WITH MICROWAVE ASSISTED HEATING

RELATED APPLICATIONS

This application is related to U.S. application Ser. No. 13/094,967 filed on Apr. 27, 2011 and entitled "COMPOSITION AND METHOD TO REMOVE EXCESS MATERIAL DURING MANUFACTURING OF SEMICONDUCTOR DEVICES", to U.S. application Ser. No. 13/276,973 filed on Oct. 19, 2011 entitled "METHOD FOR CLEANING PLATINUM RESIDUES ON A SEMICONDUCTOR SUBSTRATE", to U.S. application Ser. No. 13/296,444 filed on Nov. 15, 2011 entitled "PROCESS TO REMOVE Ni AND Pt RESIDUES FOR NiPtSi APPLICATIONS", and to U.S. application Ser. No. 13/295,333 filed on Nov. 14, 2011 entitled "PROCESS TO REMOVE Ni AND Pt RESIDUES FOR NiPtSi APPLICATIONS USING CHLORINE GAS", the disclosures of which are incorporated by reference herein.

FIELD OF THE INVENTION

The present invention relates to methods to form a silicide, and more particularly to methods to remove nickel and platinum residues.

BACKGROUND OF THE INVENTION

Silicide processes have been used to improve the conductivity of polysilicon gate and source/drain regions at the transistor level of an integrated circuit. The silicide layer provides a good ohmic contact at the interface of the gate and source/drain electrodes and the metal interconnects, reducing the contact resistance of the electrodes. The silicide materials have been changed from titanium silicide at above 130 nm device dimensions, to cobalt silicide at 90 nm to 130 nm device dimensions, to nickel silicide at 65 nm to 90 nm device dimensions, and now to nickel platinum silicide for device dimensions below 65 nm.

Advanced semiconductor fabrication processes currently use nickel and nickel alloy silicide due to their low electrical resistivity, low silicon consumption, good resistance behavior in narrow lines, and low processing temperature. A conventional method of forming a nickel silicide includes depositing a nickel layer on a semiconductor wafer, followed by a first rapid thermal process (RTP) at low temperatures of about 300 C to react nickel with silicon to produce high resistance nickel silicide phase $Ni_2Si$ or NiSi. A selective etching process is performed to remove the unreacted nickel layer, and a second RTP at higher temperatures of about 450 C is performed to convert high resistance nickel silicide phase $Ni_2Si$ or NiSi to low resistance nickel silicide phase $NiSi_2$.

A challenge of nickel silicide is the potential spiking effect, together with possible lateral diffusion to the channel region. Thus nickel alloy silicide, especially nickel platinum silicide, has been used to improve the thermal stability of nickel silicide. For example, nickel platinum silicide with 5 to 10 atomic percent (at %) platinum content can increase the silicide nucleation temperature to 900 C and the agglomeration temperature to 750 C, while still retaining the same conductivity as that of pure nickel silicide. However, platinum is difficult to etch, resulting in potential platinum residue issues during the removal of the unreacted metal layer.

Traditionally, aggressive chlorine-based chemistries that use concentrated hydrochloric acid (HCl) and an oxidant such as hydrogen peroxide ($H_2O_2$) or nitric acid ($HNO_3$) have been use to etch platinum in unreacted nickel platinum metal layer. Platinum metal can be oxidized by the oxidant to form platinum ions, which are then reacted with chloride ions to form soluble hexachloroplatinic acid.

However, aqua regia (etching solution comprising $HNO_3$+ HCl) is known to degrade nickel platinum silicide quality, especially for two step thermal processes. For example, mixed phases of nickel platinum silicide can be formed at various RTP temperatures, with lower RTP temperatures resulting in a higher proportion of metal-rich silicide phases, which are less susceptible to attack by aqua regia.

Alternative chemistries for etching platinum in nickel platinum silicide formation include sulfuric acid solutions, such as sulfuric peroxide mixture (SPM). However, though nickel metal can be successfully removed by dilute sulfuric peroxide mixtures, some portions of nickel platinum alloys may still remain, leaving behind stringers.

Therefore, what is needed is etch solutions and methods that allows for the safe removal of advanced materials (e.g., nickel and platinum) during semiconductor processing and manufacturing.

SUMMARY OF THE DESCRIPTION

In some embodiments, the present invention discloses a cleaning process to remove nickel and platinum residues using a cleaning solution with microwave assisted heating. In general, microwave radiation is supposed to be reflected from the surface of electrically conducting materials, such as metals. However, though metals reflect microwave radiation, surface penetration still occurs with the depth of penetration in metals, known as the skin depth, is in the order of microns. This renders metals layer in semiconductor devices suitable for microwave heating, since the lateral and thickness dimensions of metal layers are typically sub-micron.

In some embodiments, the present invention discloses a cleaning process using microwave assisted heating of aqua regia solution. The aqua regia solution can remove nickel and convert platinum to a soluble platinum state. The microwave energy can selectively heat platinum in an aqua regia solution, rendering platinum residues to be more soluble in aqueous solution and thereby dissolving it from the surface of the substrate.

In some embodiments, the present invention discloses methods to form nickel platinum silicide, comprising depositing a layer of nickel platinum on a silicon substrate, or a substrate comprising at least a silicon or germanium region. After performing a first rapid thermal process to react nickel and platinum with silicon to form nickel platinum silicide, the substrate is exposed to first cleaning solution, for example, of dilute nitric acid or a sulfuric peroxide mixture, which can remove the unreacted nickel and platinum. After performing a second rapid thermal process to convert nickel platinum silicide to low resistant nickel platinum silicide phase, the substrate is exposed to second solution of aqua regia to further remove the remaining nickel and platinum. Microwave assisted heating of the cleaning solutions, either for the first cleaning solution, the second cleaning solution, or both cleaning solutions, is included, for example, to enhance the nickel and platinum residue removal rates. The substrate can be optionally exposed to a solution comprising active chlorine to further remove the remaining platinum residues.

In some embodiments, the present invention discloses methods to form a semiconductor device, comprising forming a transistor structure on a semiconductor substrate and forming a nickel platinum silicide on at least a gate electrode or a source/drain region of the transistor structure.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
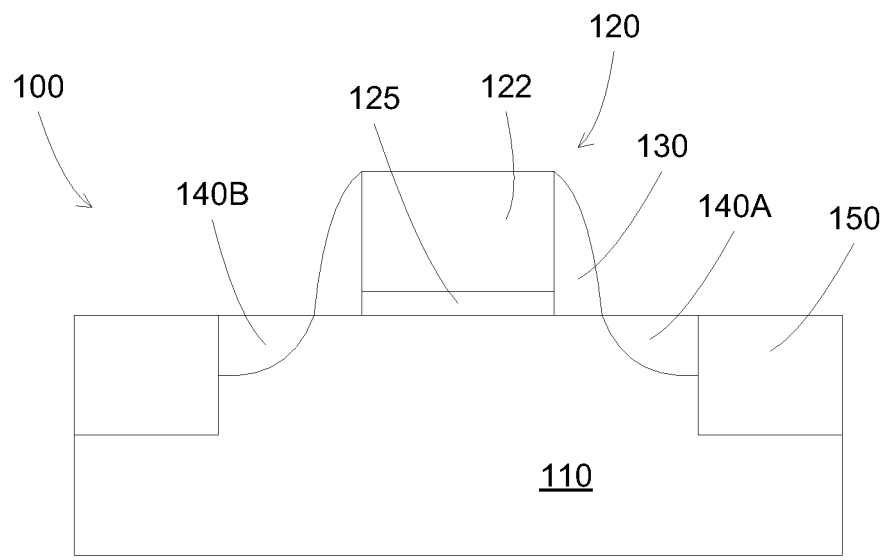
FIGS. 1A-1E illustrate an exemplary process flow for forming a semiconductor device according to some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, the present invention discloses a process to remove nickel and platinum residues on a semiconductor surface using microwave assisted heating of the cleaning solution, such as nitric acid, hydrochloric, or aqua regia. In the present specification, the terms "microwave assisted heating" or "microwave heated" are used interchangeably to mean that microwave energy is provided to be converted to thermal energy for heating. Also, the terms "microwave assisted heating of the cleaning solution" or "microwave heated cleaning solution" include heating the cleaning solution with the substrate submerged therein, so that the microwave energy can heat the metal residues in addition to heating the cleaning solution. In some embodiments, the metal residues on the substrate surface can be heated faster and quicker than the surrounding solution, resulting in a selective heating of the metal residues, and potentially heating the metal residues to a substantially higher temperature than that of the surrounding liquid.

In general, nitric acid can etch nickel and oxidize platinum, which is then reacted with chlorine to form soluble compounds. High temperature can accelerate the reaction, improving the removal rate of nickel and platinum residues from the semiconductor surface. However, safety consideration generally limits the cleaning solutions to less than 80 C, for example, aqua regia can become unstable during high temperature heating of above 40 C. In addition, pure hydrochloric acid can vaporize at room temperature, and the boiling temperature of 30-40 wt % hydrochloric acid is about 40 C, thus cleaning solution using high concentration of hydrochloric acid cannot be used effectively at high temperature. Further, high temperature processing would require constant replenishing of hydrochloric acid due to its high evaporation rate.

In some embodiments, the present invention discloses heating a cleaning solution, such as solutions comprising low boiling temperature chemicals such as hydrochloric acid, using microwave energy. In some embodiments, microwave energy can provide fast heating to the solution, effectively generating a superheated solution having high temperature with low boiling vapor. In some embodiments, microwave energy can selectively heat metals, e.g., nickel and platinum residues on the semiconductor surface, to accelerate the etching, oxidizing, and reacting of metal residues in the cleaning solution.

Microwave heating can offer many advantages, including time and energy saving, rapid heating rates, and potential reduced processing cycle time and temperature. Microwave energy is a form of electromagnetic energy, with the frequencies between 300 MHz and 300 GHz. The frequencies commonly used for microwave heating are 915 MHz and 2.45 GHz, chosen to minimize the interference with communication services.

Different materials respond differently to an application of microwave field. For example, microwave field penetrates and propagates through a dielectric material to generate an internal electric field within the dielectric material, which can induce polarization and subsequently the movements of polarized molecules. The molecules cannot respond quickly to the microwave frequency, giving rise to movement resistance and therefore heating the dielectric material. When a solution containing ions, such as an acid solution, is exposed to a microwave field, the ions move and collide to each other. The collisions convert kinetic energy to thermal energy, heating the solution. Higher concentration of ions can create more collisions, causing the solution to heat faster.

Metals react differently in a microwave field, with microwave radiation reflected from the metal surfaces and the microwave-metal interaction only restricted to the metal surfaces. Recently, research has found that powder metals absorb microwaves, e.g., metal powder can be heated to high temperatures in a microwave field, and only bulk metals reflect the microwaves with only surface penetration. The depth of penetration is on the order of microns in metals for microwave frequencies.

In some embodiments, the present invention discloses using microwave energy to heat the cleaning solution for removing nickel and platinum residues from a semiconductor substrate. In some embodiments, the dimension of nickel and platinum layer is less than the penetration depth of the microwave field, thus can be heated in a microwave field. In some embodiments, microwave heating can offer comparable or better removal rate of metal residues without the potential side effect of high temperature cleaning solutions.

In some embodiments, the present invention discloses a process to remove nickel and platinum residues from a surface of a substrate by exposing the surface to a cleaning solution heated by microwave energy. The microwave energy can selectively heat the nickel and platinum residues, resulting in high temperature nickel and platinum residues in a low temperature cleaning solution, or can provide fast heating to the cleaning solution to reduce evaporation rates.

In some embodiments, the present invention discloses a process to remove nickel and platinum residues using a microwave-heated aqua regia solution. The aqua regia can remove nickel and platinum residues from the surface. For example, nitric acid in the aqua regia solution can etch nickel, and oxidize platinum, which then reacts with chlorine ions in hydrochloric acid (in the aqua regia solution) to form soluble hexachloroplatinic acid $H_2PtCl_6$. The microwave energy can accelerate the reaction, for example, by selective heating the metal residues to facilitate their removal from the substrate surface.

To improve the nickel and platinum residue removal rates and effectiveness, high concentration and high temperature of the aqua regia solution is typically used. However, since hydrochloric acid has high vapor pressure with low boiling temperature, the two requirements of high concentration and high temperature are in direct conflict, and thus an aqua regia solution comprising about 30 wt % hydrochloric acid and about 14 wt % nitric acid can typically be heated to about 40 C or less.

In some embodiments, the present invention discloses microwave-heating nickel platinum residues in an aqua regia solution, for example, to improve the efficiency or the removal rates of the nickel platinum residues. The microwave energy is typically about 150 W, preferably less than about 500 W, and more preferably less than about 200 W. The cleaning time is typically less than about 10 minutes, and preferably between about 1 and about 5 minutes. Conventional heating can also be used to heat the aqua regia to a temperature of less than about 60 C, and preferably about 40 C or lower.

In some embodiments, the cleaning process is performed for less than about 10 minutes, and preferably about 5 minutes or less. The temperature of the solution, e.g., the aqua regia can be less than about 80 C or less than about 60 C. In some embodiments, a water rinse is performed after the cleaning steps. For example, the surface is rinsed with water at room temperature for about 2 minutes.

In some embodiments, the semiconductor surface can be first exposed to a dilute nitric acid solution, a sulfuric acid solution, or a sulfuric peroxide solution (comprising a mixture of sulfuric acid and hydrogen peroxide) to remove nickel and some portion of platinum. For example, the semiconductor surface can be exposed to a sequence of a sulfuric peroxide solution followed by a microwave heated aqua regia solution; or a dilute nitric acid followed by a microwave heated aqua regia solution. In some embodiments, the sulfuric peroxide solution or the dilute nitric acid can also be microwave heated.

In some embodiments, the present invention discloses a method for cleaning residues from a surface of a substrate, comprising exposing the surface, after a first rapid thermal process, to a first solution comprising dilute nitric acid, wherein the first solution does not comprise a chlorine-based acid. Alternatively, the first solution can comprise a mixture of sulfuric acid and hydrogen peroxide solution. Subsequently, the surface is exposed, after a second rapid thermal process, to a second solution containing a mixture of nitric acid and hydrochloric acid.

In some embodiments, the separation of etching materials, e.g., nickel etching in a first dilute nitric acid and platinum etching in a second aqua regia solution, can be effective in removing nickel and platinum residue while preventing damage to the substrate. For example, platinum is unreactive, and generally needed to be oxidized to platinum ions, which then can be dissolved in chlorine-based chemistries, such as aqua regia solution to form soluble hexachloroplatinic acid $H_2PtCl_6$ $(2H^+—(Pt^+-6Cl^-)^{2-}$. However, platinum can be oxidized to various oxidation states, such as $Pt^+$, $Pt^{3+}$, or $Pt^{4+}$, each with different solubility in chlorine-based chemistries. For example, $Pt^+$ and $Pt^{3+}$ oxidation states are harder to dissolve than $Pt^{4+}$ oxidation state, and thus directly dissolving multiple oxidation states of platinum ions in aqua regia might require high concentration of hydrochloric acid, such as a typical aqua regia solution of about 30 wt % hydrochloric acid and about 14 wt % nitric acid. The high concentration aqua regia, though effective in dissolving platinum, can also cause damage to the device. Alternatively, platinum can be dissolved in strong oxidant chemistries, such as a sulfuric peroxide mixture, but the strong oxidant etching of platinum tends to be incomplete, leaving platinum residues. In the present specification, the terms "platinum etch", "platinum removal", or "platinum dissolving" have similar meaning, which is to remove solid platinum from the surface of the substrate.

In some embodiments, the process conditions for microwave heated aqua regia is similar to the above described process conditions. In some embodiments, the concentration of the dilute nitric acid in the first cleaning solution is less than about 20 wt %, and preferably less than about 10 wt %. The concentration of dilute nitric acid is also preferably higher than about 2 or about 3 wt %. In some embodiments, the concentration of the nitric acid in dilute aqua regia is less than about 10-about 15 wt % or the concentration of the hydrochloric acid in dilute aqua regia is less than about 16-about 20 wt %. For example, the dilute aqua regia can comprise less than about 10 wt % nitric acid with less than about 20 wt % hydrochloric acid. Alternatively, the dilute aqua regia can comprise less than about 15 wt % nitric acid with less than about 16 wt % hydrochloric acid.

In some embodiments, the cleaning process is performed for less than about 10 minutes, and preferably about 5 minutes or less. The temperature of the solution, e.g., the dilute nitric acid, or the dilute aqua regia, can be less than about 80 C or less than about 60 C. In some embodiments, a water rinse is performed after the cleaning steps. For example, the surface is rinsed with water after being exposed to dilute nitric acid, or after being exposed to dilute aqua regia solution.

In some embodiments, the semiconductor surface can be further exposed to a chlorine solution comprising chlorine gas or ions to further remove any remaining metal residues. The chlorine solution can comprise dilute hydrochloric acid. Alternatively, the chlorine solution can comprise a solution comprising dissolved chlorine gas. For example, the semiconductor surface can be exposed to a sequence of a microwave heated aqua regia solution followed by a chlorine solution. In some embodiments, the chlorine solution can also be microwave heated. In some embodiments, the aqua regia solution and the chlorine solution are applied in sequence after thermal processing, where the aqua regia etches nickel and platinum, and the chlorine solution further dissolves remaining platinum.

In some embodiments, the present invention discloses a nickel and platinum cleaning process using a two step cleaning process where the first cleaning step etches and platinum, and the second cleaning step cleans any remaining platinum. For example, the first cleaning step can be performed after a rapid thermal process, reacting nickel and platinum with silicon to form nickel platinum silicide. In addition the first cleaning steps can be tailored to convert the platinum to a more soluble state which can facilitate the second cleaning step.

In some embodiments, the first cleaning step comprises an aqua regia solution to etch nickel. Aqua regia also comprises nitric acid, which is an oxidant acid, and thus can partially oxidize platinum, for example, to platinum oxide $Pt^{++}$, which has high solubility in hydrochloric acid. The remaining platinum oxides that have not been dissolved in aqua regia are then subjected to the second cleaning step of a chlorine solution, dissolving the remaining platinum oxide.

In some embodiments, chlorine gas is bubbled through a fluid to form a chlorine solution. The fluid can comprise water, acid, or an organic solvent. In some embodiments, the solution, or the chlorine gas, is heated to a temperature less than about 80 C, and preferably between about 40 and about 60 C. In some embodiments, the process conditions for microwave heated aqua regia is similar to the above described process conditions.

In some embodiments, the present invention discloses a process to remove nickel and platinum residues using dilute nitric acid, microwave-heated aqua regia and chlorine solution. In some embodiments, the dilute nitric acid, aqua regia, and chlorine solution are applied in sequence after thermal processing, where the dilute nitric acid mainly etches nickel, the aqua regia mainly dissolves platinum, and the chlorine solution further dissolves remaining platinum.

In some embodiments, the present invention discloses a nickel and platinum cleaning process using a three step cleaning process where the first cleaning step mainly etches nickel, the second cleaning step mainly etches platinum, and the third cleaning step cleans any remaining platinum. For example, the first and second cleaning steps can be performed after a rapid thermal process, reacting nickel and platinum with silicon to form nickel platinum silicide. In addition the first and second cleaning steps can be tailored to convert the platinum to a more soluble state which can facilitate the third cleaning step.

In some embodiments, the present invention discloses a method for cleaning residues from a surface of a substrate, comprising exposing the surface, after a first rapid thermal process, to a first solution comprising dilute nitric acid, wherein the first solution does not comprise a chlorine-based acid. Subsequently, the surface is exposed, after a second rapid thermal process, to a second solution containing a mixture of nitric acid and hydrochloric acid. Afterward, the surface is exposed to a third solution containing dissolved chlorine gas.

In some embodiments, the present invention discloses methods to form nickel platinum silicide, using the present microwave heated aqua regia solution to remove nickel and platinum residues. In some embodiments, the present invention discloses methods to form a nickel platinum silicide, comprising providing a substrate having at least one silicon-containing region. For example, the silicon-containing region can be a polysilicon gate electrode, or a silicon germanium strain source or drain region. A layer comprising nickel and platinum is then formed on the substrate, for example, by a physical vapor deposition process. A thermal process, preferably a rapid thermal process, is performed on the substrate comprising the nickel platinum layer, reacting the nickel and platinum with the silicon in the substrate to form nickel platinum silicide. The substrate is then exposed to a microwave heated cleaning solution comprising aqua regia comprising dilute nitric acid and hydrochloric acid, for example, to remove nickel and platinum residues from the nickel platinum layer.

In some embodiments, the process conditions for microwave heated aqua regia is similar to the above described process conditions. Further, other cleaning processes described above can also be applied, such as the nitric acid and hydrochloric acid concentrations, the time and the temperature of the cleaning solution, and the additional water rinse steps. In some embodiments, the rapid thermal process is performed at temperature between about 300 C to about 450 C for less than about 1 minute in nitrogen ambient.

In some embodiments, the present invention discloses methods to form nickel platinum silicide, using a two step cleaning process to remove nickel and platinum residues. The first cleaning step can comprise a dilute nitric acid solution or a sulfuric acid solution (e.g., a sulfuric peroxide solution) to remove nickel and some portion of platinum. The second cleaning step can comprise microwave heated aqua regia solution to dissolve the platinum oxides.

In some embodiments, the present invention discloses methods to form a nickel platinum silicide, comprising providing a substrate having at least one silicon-containing region. For example, the silicon-containing region can be a polysilicon gate electrode, or a silicon germanium strain source or drain region. A layer comprising nickel and platinum is then formed on the substrate, for example, by a physical vapor deposition process. A thermal process, preferably a rapid thermal process, is performed on the substrate comprising the nickel platinum layer, reacting the nickel and platinum with the silicon in the substrate to form nickel platinum silicide. The substrate is then exposed to a first cleaning solution comprising dilute nitric acid or sulfuric peroxide solution, for example, to remove unreacted nickel (and/or platinum) from the nickel platinum layer. A second thermal process, also preferably a rapid thermal process, is performed on the substrate comprising the nickel platinum silicide, to further react the nickel platinum silicide with silicon in the substrate to form low resistive nickel platinum silicide. The substrate is then exposed to a microwave heated second cleaning solution comprising aqua regia comprising dilute nitric acid and hydrochloric acid, for example, to remove platinum residues from the remaining nickel platinum layer.

In some embodiments, the process conditions for microwave heated aqua regia is similar to the above described process conditions. Further, other cleaning processes described above can also be applied, such as the nitric acid and hydrochloric acid concentrations, the time and the temperature of the cleaning solution, and the additional water rinse steps.

In some embodiments, the first rapid thermal process is performed at temperature below about 380 C, for example, at about 300 C for less than about 1 minute in nitrogen ambient. In some embodiments, the second rapid thermal process is performed at temperature above about 300 C, for example, at about 450 C for less than about 1 minute in nitrogen ambient.

In some embodiments, the present invention discloses methods to form nickel platinum silicide, using another two step cleaning process to remove nickel and platinum residues. The first cleaning step can comprise a microwave heated aqua regia solution to remove nickel and platinum. The second cleaning step can comprise a chlorine solution to clean any remaining residues of platinum.

In some embodiments, the present invention discloses methods to form a nickel platinum silicide, comprising providing a substrate having at least one silicon-containing region. For example, the silicon-containing region can be a polysilicon gate electrode, or a silicon germanium strain source or drain region. A layer comprising nickel and platinum is then formed on the substrate, for example, by a physical vapor deposition process. A thermal process, preferably a rapid thermal process, is performed on the substrate comprising the nickel platinum layer, reacting the nickel and platinum with the silicon in the substrate to form nickel platinum silicide. The substrate is then exposed to a first cleaning solution comprising aqua regia comprising dilute nitric acid and hydrochloric acid, for example, to remove nickel and platinum residues from the nickel platinum layer. Afterward, the substrate is exposed to a chlorine solution, cleaning any remaining residues of platinum.

In some embodiments, the process conditions for microwave heated aqua regia is similar to the above described process conditions. Further, other cleaning processes described above can also be applied, such as the nitric acid and hydrochloric acid concentrations, the time and the temperature of the cleaning solution, the chlorine solution conditions, and the additional water rinse steps. In addition, the process conditions for the rapid thermal process described above can also be applied, such as the temperature, the ambient, and the processing time of the rapid thermal process.

In some embodiments, the present invention discloses methods to form nickel platinum silicide, using the three step cleaning process to remove nickel and platinum residues. The first cleaning step mainly etches nickel, comprising a first solution to remove nickel and some portion of platinum. For example, the first solution can be dilute nitric acid. Alternatively, the first solution can be a mixture of nitric acid with a non-chlorine-based acid or non-chlorine-based chemical, such as a solvent, an acid comprising fluoride (e.g., HF), or an organic acid (e.g., acetic acid or carbonyl acid). The dilute nitric acid solution can also oxidize a portion of the platinum residues, rendering them easier to dissolve in the second cleaning solution. Alternatively, the first solution can be a mixture of sulfuric acid and hydrogen peroxide. The process conditions of the first cleaning step can be optimized to facilitate the subsequent platinum removal process, for example, to oxidize platinum to $Pt^{4+}$, which can be easily reacted with chlorine-based chemistries to form soluble platinum compounds, instead of to $Pt^+$ or $Pt^{3+}$, which can be harder to remove in the second cleaning step using dilute aqua regia. Further, the dilute nitric acid solution can be tailored to prevent damage to the substrate, for example, by employing cleaning solutions that are not designed to aggressively remove platinum.

The second cleaning step mainly removes platinum. For example, the second solution in the second step can comprise a microwave heated aqua regia solution, with the nitric acid component in the aqua regia solution oxidizing the platinum residues, the hydrochloric acid element in the aqua regia solution reacting with the platinum oxide to form soluble hexachloroplatinic acid, and the microwave energy selectively heating the metals to accelerate the reactions. Further, the second cleaning step can be assisted by the oxidizing action of platinum in the first cleaning step through the dilute nitric acid. Therefore, the aqua regia solution can be made more dilute, for example, as compared to typical prior art aqua regia platinum etching of about 14 wt % nitric acid and about 30 wt % hydrochloric acid.

The third cleaning step mainly removes remaining platinum after the first two cleaning steps. For example, the third solution in the third cleaning step can comprise a chlorine solution, which is a solution containing dissolved chlorine gas, to convert the less soluble chloroplatinous acid to the more soluble chloroplatinic acid.

In some embodiments, the present invention discloses methods to form a nickel platinum silicide, comprising providing a substrate having at least one silicon-containing region. For example, the silicon-containing region can be a polysilicon gate electrode, or a silicon germanium strain source or drain region. A layer comprising nickel and platinum is then formed on the substrate, for example, by a physical vapor deposition process. A first thermal process, preferably a rapid thermal process, is performed on the substrate comprising the nickel platinum layer, reacting the nickel and platinum with the silicon in the substrate to form various phases of nickel platinum silicide. The substrate is then exposed to a first cleaning solution comprising dilute nitric acid or a sulfuric peroxide solution, for example, to remove unreacted nickel (and/or platinum) from the nickel platinum layer. As disclosed above, the dilute nitric acid or the sulfuric peroxide solution mainly removes nickel and partially oxidizes platinum. In some embodiments, some platinum can be dissolved or removed. A second thermal process, also preferably a rapid thermal process, is performed on the substrate comprising the nickel platinum silicide, to further react the various phases of nickel platinum silicide with silicon in the substrate to form low resistive nickel platinum silicide. The substrate is then exposed to a second microwave heated cleaning solution comprising aqua regia comprising dilute nitric acid and hydrochloric acid, for example, to remove platinum residues from the remaining nickel platinum layer. For example, the nitric acid can oxidize platinum, and the hydrochloric acid can dissolve the platinum oxide. As disclosed above, the present aqua regia solution can be more dilute, but still effective, than typical aqua regia used in cleaning nickel platinum residues, perhaps due to the prior oxidation of platinum to $Pt^{4+}$ by the first cleaning step using dilute nitric acid. Afterward, the substrate is exposed to a chlorine solution, cleaning any remaining residues of platinum.

In some embodiments, the process conditions for microwave heated aqua regia is similar to the above described process conditions. Further, other cleaning processes described above can also be applied, such as the nitric acid and hydrochloric acid concentrations, the time and the temperature of the cleaning solution, the chlorine solution conditions, and the additional water rinse steps. In addition, the process conditions for the rapid thermal process described above can also be applied, such as the temperature, the ambient, and the processing time of the rapid thermal process.

In some embodiments, the present invention discloses methods to form a semiconductor device, comprising forming at least a nickel platinum silicide contact for a transistor structure. The transistor structure can comprise a gate electrode and a source/drain region over a semiconductor substrate. The gate electrode can comprise an exposed doped polysilicon layer. The source/drain region can comprise an exposed silicon or a silicon germanium area. A layer comprising nickel and platinum is then formed on the substrate, for example, by a physical vapor deposition process. The nickel platinum layer can be deposited on the exposed portions of the gate electrode and source/drain region, covering the gate electrode or the source/drain region.

An optional first rapid thermal process is performed on the substrate, reacting the nickel and platinum with the silicon in the gate electrode or the source/drain region to form various phases of nickel platinum silicide, such as nickel rich silicide. The substrate is then optionally exposed to a first cleaning solution comprising dilute nitric acid or a sulfuric peroxide solution, for example, to remove unreacted nickel (and/or platinum) from the nickel platinum layer. A second thermal process, also preferably a rapid thermal process, is performed on the substrate comprising the nickel platinum silicide, to further react the various phases of nickel platinum silicide with silicon in the substrate to form low resistive nickel platinum silicide. The substrate is then exposed to a second microwave heated cleaning solution comprising aqua regia comprising dilute nitric acid and hydrochloric acid, for example, to remove platinum residues (including Pt or NiPt residues) from the remaining nickel platinum layer. Afterward, the substrate is exposed to a chlorine solution, cleaning any remaining residues of platinum.

In some embodiments, the process conditions for microwave heated aqua regia is similar to the above described process conditions. Further, other cleaning processes described above can also be applied, such as the nitric acid and hydrochloric acid concentrations, the time and the temperature of the cleaning solution, the chlorine solution conditions, and the additional water rinse steps. In addition, the process conditions for the rapid thermal process described above can also be applied, such as the temperature, the ambient, and the processing time of the rapid thermal process.

In some embodiments, the post silicidation clean process is selective towards other exposed materials such as $Si_3N_4$ (spacers), $SiO_2$ (field oxide), NiPtSi (contact electrodes), and NiPtSiGe (contact electrodes of source/drain for strain applications).

FIGS. 1A-1E illustrate an exemplary process flow for forming a semiconductor device according to some embodiments of the present invention. In FIG. 1A, a transistor structure 100 is formed on a substrate 110, comprising isolation regions 150 to isolate the neighboring devices, source and drain regions 140A and 140B sandwiching a gate electrode 120 comprising a gate dielectric 125 and a gate conductor 122. Spacers 130 cover the sidewalls of the gate electrode 120. The substrate 110 can be a semiconductor substrate, or any substrates having a layer of semiconductor layer. For example, the substrate can be a single crystal silicon substrate. The substrate can be a silicon-germanium substrate, or can have a silicon germanium layer disposed on top. The gate conductor can comprise doped polysilicon. The top surfaces of the gate electrode 120 and the source and drain regions 140A and 140B are preferably exposed. FIG. 1A shows an exemplary metal-oxide-semiconductor field effect transistor (MOSFET) structure 100, but the invention is not so limited, and can include any transistor structure, such as bipolar transistors, fin transistors or double gate transistors. In addition, the present process flow describes a silicidation process for gate electrode 120 and on source and drain regions 140A and 140B, but the invention is not so limited, and can include silicidation for any combination, for example, for only for the gate electrode 120, or only for the source or drain regions 140A or 140B.

Figure 1B:
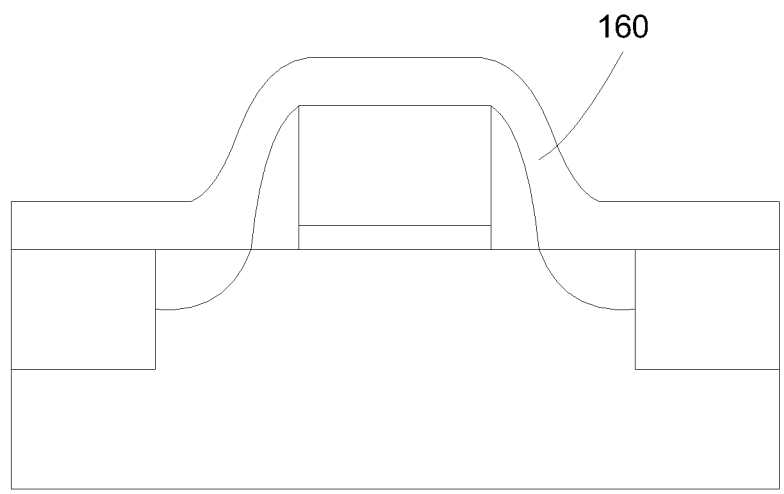

In FIG. 1B, a layer 160 comprising nickel and platinum is formed on the transistor structure, covering the exposed surfaces of the gate electrode and the source and drain regions. The nickel platinum layer 160 is preferably deposited using PVD process. The platinum concentration can be between about 5 wt % and about 15 wt %, and preferably at about 10 wt %. Additional surface preparation can be performed, such as a preclean step with dilute hydrofluoric acid and/or a native oxide removal step for the exposed gate electrode and source/drain regions.

Figure 1C:
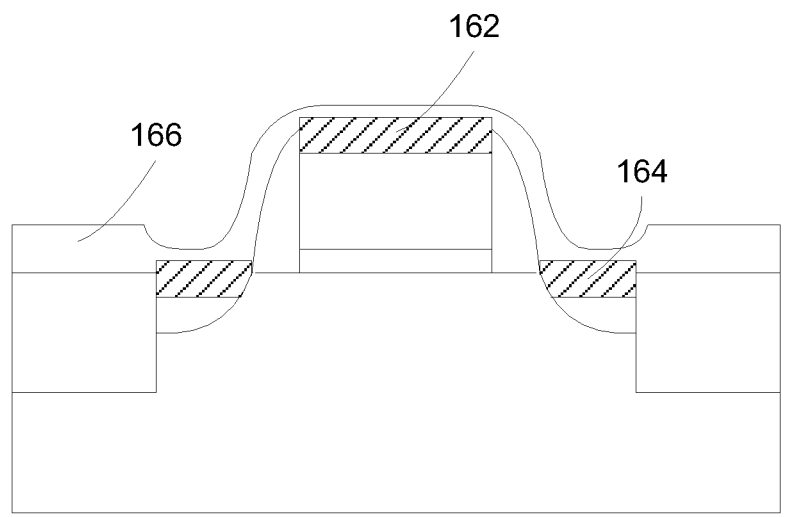

In FIG. 1C, the substrate, together with the transistor structure 100 and the nickel platinum layer 160 is annealed, for example, by a first rapid thermal process, to react nickel and platinum in the nickel platinum layer 160 with the silicon in the gate electrode 120 and source/drain regions 140A/140B. A nickel platinum silicide layer 162 is formed at the top surface of the gate electrode 120, and nickel platinum silicide layers 164 are formed at the top surface of the source/drain regions. Unreacted nickel platinum layer 166 remains in areas protected by the spacers and the isolation regions 150, and can comprise excess nickel platinum after the rapid thermal reaction. The first rapid thermal process can comprise an anneal in nitrogen ambient, at temperature lower than 380 C for less than a minute. For example, a preferred rapid thermal process comprises annealing at about 300 C for about 30 seconds. The first rapid thermal process can react nickel and platinum with silicon to form various phases of nickel platinum silicide, for example, high resistive phases of mono-nickel platinum silicide or di-nickel platinum silicide.

Figure 1D:
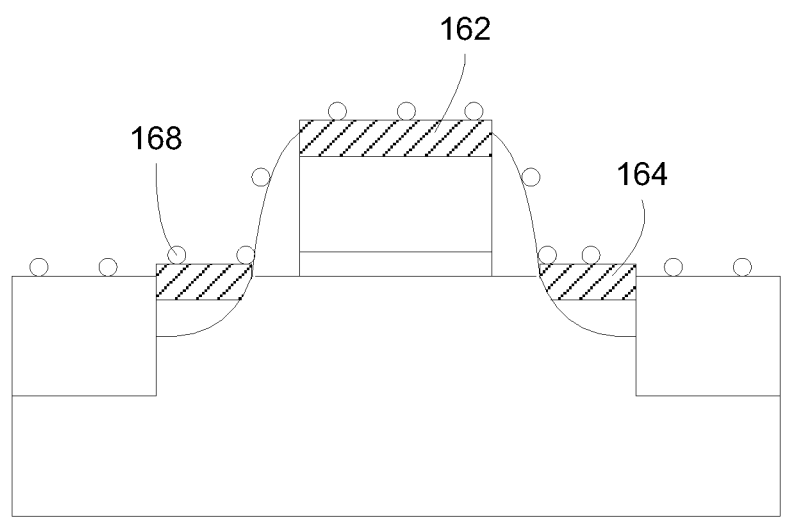

In FIG. 1D, the substrate surface, comprising unreacted nickel platinum layer 166, together with nickel platinum silicide layers 162, 164 at the gate electrode and the source/drain regions, are exposed to a first cleaning solution comprising dilute nitric acid or sulfuric peroxide solution. In some embodiments, the first cleaning solution comprises only dilute nitric acid, i.e., nitric acid diluted in water. In some embodiments, the first cleaning solution comprises dilute nitric acid and a non-chlorine based acid. The exclusion of chlorine based acid such as hydrochloric acid can serve to reduce potential damage caused by chlorine based acid after the first rapid thermal process. For example, the first solution can comprise a solvent, an acid containing fluorine, or an organic acid (e.g., an acid containing carbon). In some embodiments, the first cleaning solution comprises a mixture of sulfuric acid and hydrogen peroxide. In some embodiments, the first cleaning process comprises exposing the cleaning solution with the submerged substrate to a microwave energy.

In some embodiments, the microwave energy is about 150 W, preferably less than about 500 W, and more preferably less than about 200 W. Conventional heating, e.g., resistive heating, can also be used to heat the cleaning solution to a temperature of less than about 60 C, and preferably about 40 C or lower.

In some embodiments, the concentration of the dilute nitric acid in the first cleaning solution is less than about 15 wt %, and preferably less than about 10 wt % or about 7 wt %. In some embodiments, the dilute nitric acid concentration can be greater than about 3 wt %. The low concentration of nitric acid can effectively remove unreacted nickel, without damaging the transistor device, such as without damaging the underlying substrates comprising TiN, SiN, and $SiO_2$.

In some embodiments, the first cleaning step is performed for about 5 minutes at temperature about 40 C, followed by a water rinse at 25 C (e.g., room temperature) for about 2 minutes. After the first cleaning with dilute nitric acid solution, some of the nickel is removed and some platinum is oxidized, leaving some remaining residues 168 of nickel, platinum, platinum oxide, and nickel platinum compounds. In some embodiments, the first rapid thermal process and/or the first cleaning are optional.

Figure 1E:
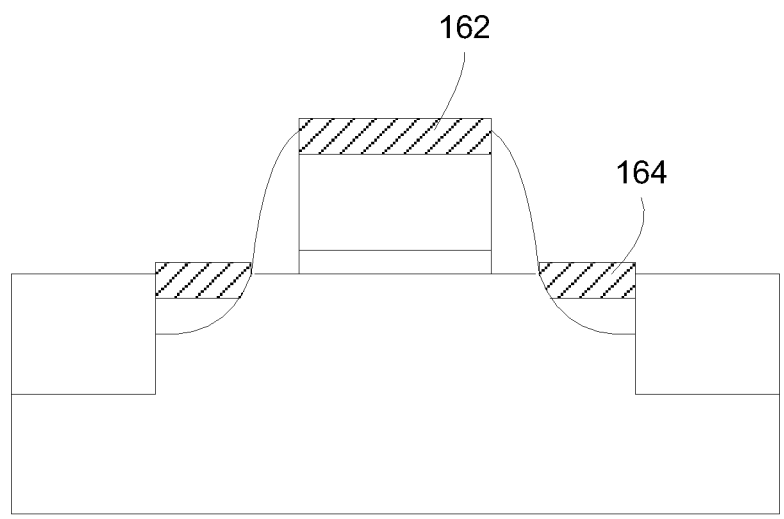

In FIG. 1E, the substrate is annealed, for example, by a second rapid thermal process, to further reduce the resistance of the nickel platinum silicide. For example, the high resistive phases of mono-nickel platinum silicide or di-nickel platinum silicide can further react with silicon to form a low resistive phase of nickel platinum di-silicide. The second rapid thermal process can comprise an anneal in nitrogen ambient, at temperature higher than about 300 C for less than about 1 minute. For example, a preferred rapid thermal process comprises annealing at about 450 C for about 30 seconds.

After the second rapid thermal process, the substrate is treated with a second microwave heated cleaning solution comprising aqua regia. The aqua regia can remove remaining nickel, oxidize remaining platinum, dissolve platinum oxide, and in general, clean the surface of residues of nickel, platinum and nickel platinum compounds. As discussed above, the aqua regia is preferably diluted, for example, up to 2× more diluted than prior art aqua regia solution for cleaning nickel platinum residues. The present diluted aqua regia solution can reduce damage to the transistor devices, and can still be effective in removing nickel platinum residues.

In some embodiments, the microwave energy is about 150 W, preferably less than about 500 W, and more preferably less than about 200 W. Conventional heating, e.g., resistive heating, can also be used to heat the aqua regia to a temperature of less than about 60 C, and preferably about 40 C or lower.

In some embodiments, the dilute aqua regia comprises about 7 wt % nitric acid and about 20 wt % hydrochloric acid. In some embodiments, the dilute aqua regia comprises about 14 wt % nitric acid and about 15 wt % hydrochloric acid. In some embodiments, the aqua regia cleaning is performed for about 5 minutes at temperature about 40 C, followed by a water rinse at 25 C (e.g., room temperature) for about 2 minutes.

In some embodiments, the substrate is treated with a third cleaning solution to further remove any remaining nickel and platinum residues, such as a cleaning solution comprising active chlorine can be used in the third cleaning step. For example, solution comprising dissolved chlorine gas can be applied on the surface for less than about 30 minutes, preferably less than about 5 minutes, at temperature less than about 80 C, preferably at about 20 C to about 60 C. In some embodiments, chlorine gas is bubbled to a fluid to form the chlorine solution. The fluid can comprise water, acid, or an organic solvent. In some embodiments, the solution, or the chlorine gas, is heated to a temperature less than about 80 C, and preferably between about 40 and about 60 C.

Alternatively, the third cleaning solution can comprise a hydrochloric acid solution at about 3 to about 10 wt %, which can be applied on the semiconductor surface for another about 3 to about 5 minutes at about 40 C to about 80 C. In some embodiments, the first cleaning process comprises exposing the cleaning solution with the submerged substrate to a microwave energy.

In some embodiments, the microwave energy is about 150 W, preferably less than about 500 W, and more preferably less than about 200 W. Conventional heating, e.g., resistive heating, can also be used to heat the cleaning solution to a temperature of less than about 60 C, and preferably about 40 C or lower.

In some embodiments, the present multiple step cleaning using dilute nitric acid, dilute aqua regia, and chlorine solution can effectively remove nickel, platinum and nickel/platinum residues without damage to the transistor device, such as forming shallow craters devoid of silicide in the Ni(Pt)Si film. Further, the present cleaning process does not attack the different device materials, such as TiN, SiN spacers and SiO$_2$. The present cleaning solutions further have additional advantages of prolonged shelf life, for example, up to several months, due to the dilute concentration of nitric acid and aqua regia. Dilute nitric acid can be easier to use than concentrated nitric acid, and compared to prior art solutions, such as SPM. In general, dilute nitric acid does not attack platinum, e.g., the portion of platinum oxide states, e.g., $Pt^+$ or $Pt^{3+}$, that are difficult to be dissolved in hydrochloric acid can be much smaller than the portion of platinum oxide state, e.g., $Pt^{4+}$, that are more soluble in hydrochloric acid. In addition, microwave heated cleaning solutions can improve the efficiency of the metal residue removal.

In some embodiments, the present cleaning solutions can improve nickel and platinum residue removal, especially at high concentrations of platinum (e.g., >5 wt % platinum in nickel platinum layer).

Figure 2:
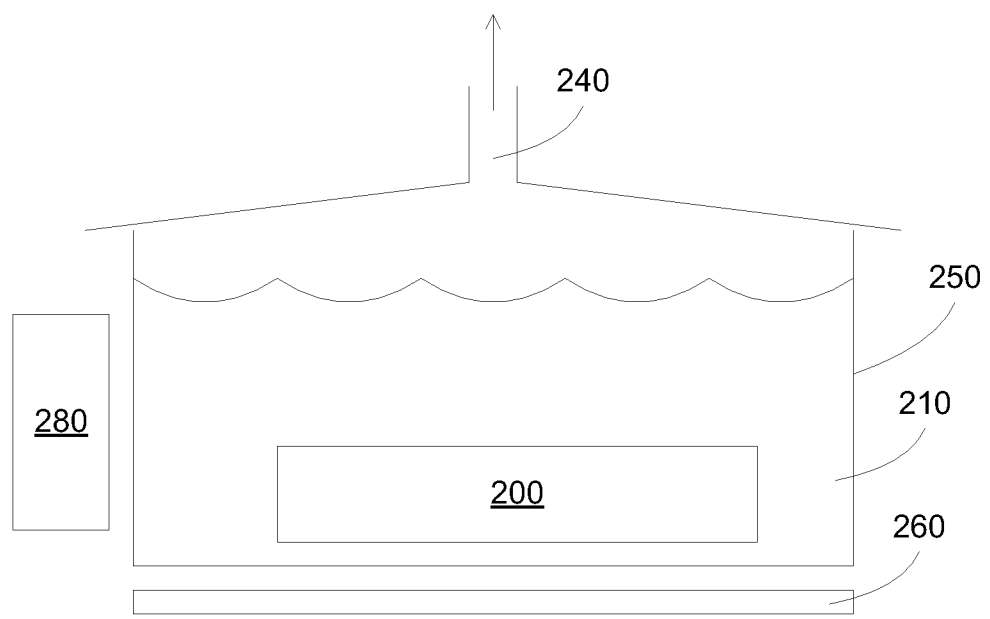
FIG. 2 illustrates an exemplary cleaning apparatus employing a cleaning solution according to some embodiments of the present invention.

FIG. 2 illustrates an exemplary cleaning apparatus employing a cleaning solution according to some embodiments of the present invention. A container 250 contains a liquid 210, such as aqua regia. A lid having an exhaust port 240 is disposed on the container 250 to capture any released gas. A substrate 200 is submerged in the liquid 210. A microwave generator 280 provides a microwave field to the liquid 210 and to the substrate 200 for heating with microwave energy. Optionally, a conventional heater, such as a resistive heater 260, is included to heat the liquid 210.

Figure 3:
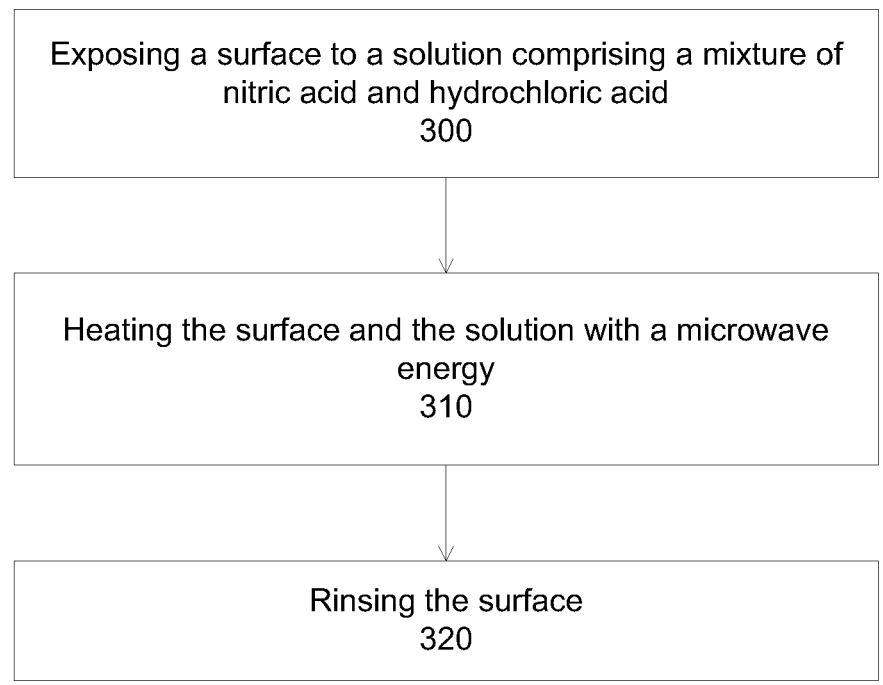
FIG. 3 illustrates an exemplary process flowchart for cleaning a surface according to some embodiments of the present invention.

FIG. 3 illustrates an exemplary process flowchart for cleaning a surface according to some embodiments of the present invention. Operation 300 exposes a surface to a first solution comprising a mixture of nitric acid and hydrochloric acid. Operation 310 heats the surface and the solution with a microwave energy. Operation 320 rinses the surface.

Figure 4:
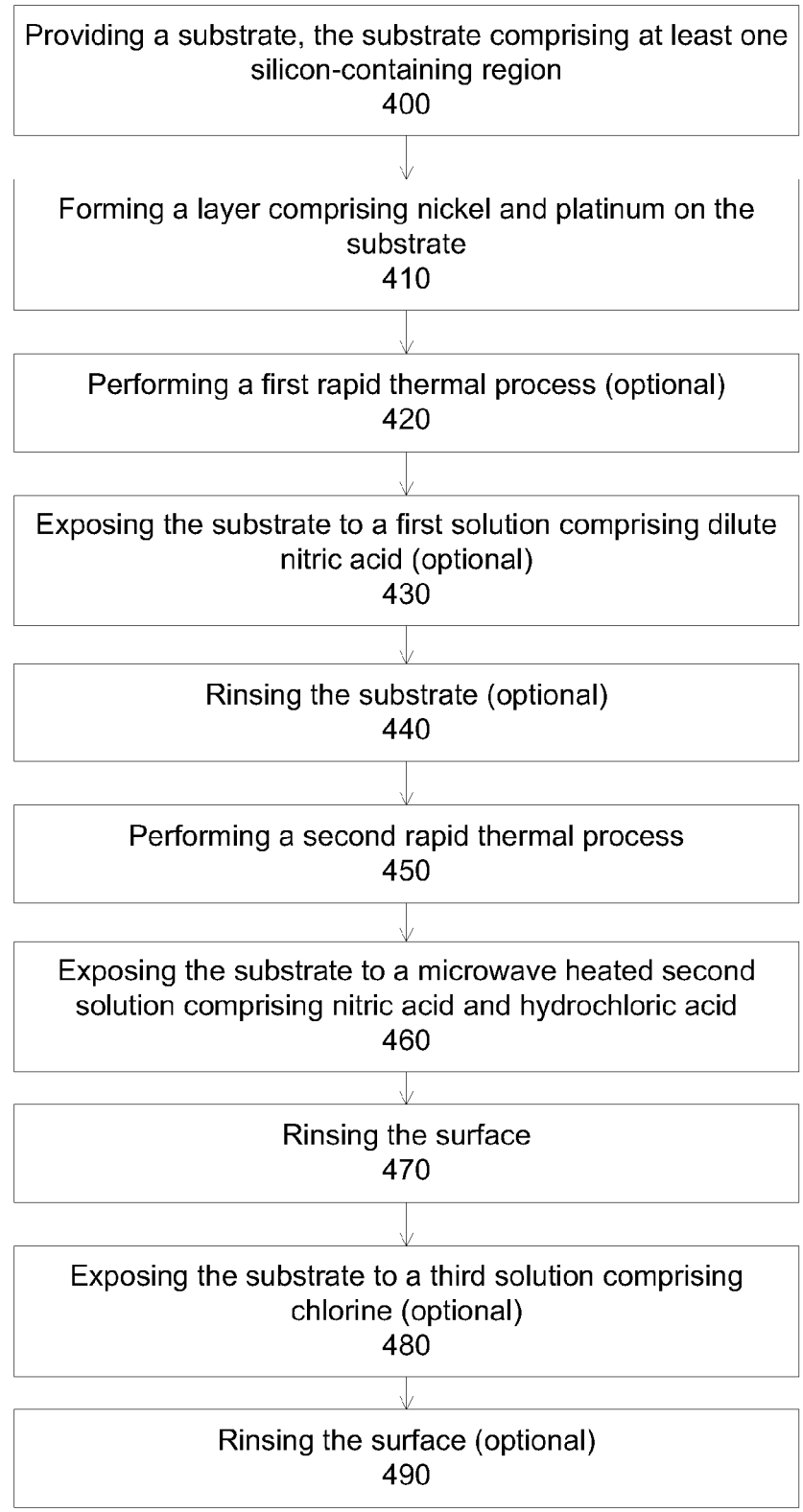
FIG. 4 illustrates an exemplary process flowchart for forming a nickel platinum silicide according to some embodiments of the present invention.

FIG. 4 illustrates an exemplary process flowchart for forming a nickel platinum silicide according to some embodiments of the present invention. Operation 400 provides a substrate, the substrate comprising at least one silicon-containing region. Operation 410 forms a layer comprising nickel and platinum on the substrate. Operation 420 optionally performs a first rapid thermal process. Operation 430 optionally exposes the substrate to a first solution comprising dilute nitric acid. Operation 440 optionally rinses the substrate. Operation 450 performs a second rapid thermal process. Operation 460 exposes the substrate to a microwave heated second solution comprising nitric acid and hydrochloric acid. The substrate is also exposed to the microwave energy to be heated together with the second solution. Operation 470 rinses the surface. Operation 480 optionally exposes the substrate to a third solution comprising chlorine. For example, the third solution can comprise hydrochloric acid, or dissolved chlorine gas. Operation 490 optionally rinses the surface.

Figure 5:
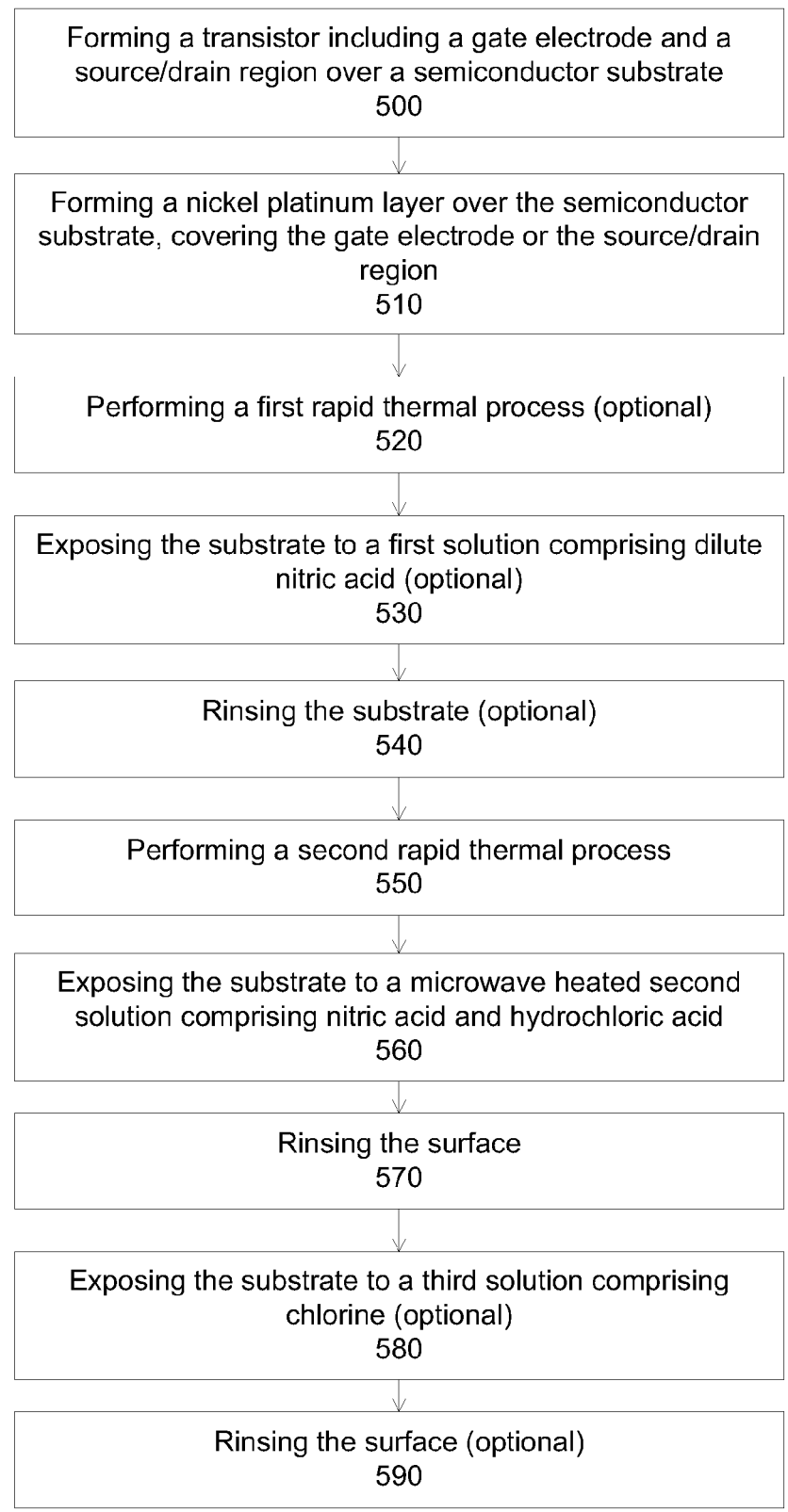
FIG. 5 illustrates an exemplary process flowchart for forming a semiconductor device according to some embodiments of the present invention.

FIG. 5 illustrates an exemplary process flowchart for forming a semiconductor device according to some embodiments of the present invention. Operation 500 forms a transistor including a gate electrode and a source/drain region over a semiconductor substrate. Operation 510 forms a nickel platinum layer over the semiconductor substrate, covering the gate electrode or the source/drain region. Operation 520 optionally performs a first rapid thermal process. Operation 530 optionally exposes the substrate to a first solution comprising dilute nitric acid. Operation 540 optionally rinses the substrate. Operation 550 performs a second rapid thermal process. Operation 560 exposes the substrate to a microwave heated second solution comprising nitric acid and hydrochloric acid. The substrate is also exposed to the microwave energy to be heated together with the second solution. Operation 570 rinses the surface. Operation 580 optionally exposes the substrate to a third solution comprising chlorine. For example, the third solution can comprise hydrochloric acid, or dissolved chlorine gas. Operation 590 optionally rinses the surface.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a semiconductor device, the method comprising:

forming a transistor including a gate electrode and a source/drain diffused layer over a semiconductor substrate;

forming a nickel platinum layer over the semiconductor substrate, covering at least the gate electrode or the source/drain diffused layer;

performing a first thermal process;

exposing the semiconductor substrate to a first solution comprising nitric acid or sulfuric acid;

performing a second rapid thermal process;

exposing the substrate to a microwave heated solution comprising a mixture of nitric acid and hydrochloric acid.

2. A method as in claim 1 wherein the microwave energy is less than about 500 W.

3. A method as in claim 1 wherein the first solution is microwave heated.

4. A method as in claim 1 wherein the first rapid thermal process is performed at temperature less than about 380 C.

5. A method as in claim 1 wherein the concentration of the nitric acid in the first solution is less than about 10 wt %.

6. A method as in claim 1 wherein the second rapid thermal process is performed at temperature greater than about 300 C.

7. A method as in claim 1 wherein the concentration of the nitric acid in the second solution is less than about 10 wt %.

8. A method as in claim 1 wherein the concentration of the hydrochloric acid in the second solution is less than about 20 wt %.

9. A method as in claim 1, further comprising exposing the substrate to a solution comprising chlorine.

10. A method as in claim 9 wherein the solution comprising chlorine comprises hydrochloric acid.

11. A method as in claim 9 wherein the solution comprising chlorine comprises dissolved chlorine gas.

* * * * *